73-632 SR
12/16/80 XR 4,240,003

United States Patent [19]

Larson, III

[11] 4,240,003

[45] Dec. 16, 1980

[54] APPARATUS AND METHOD FOR SUPPRESSING MASS/SPRING MODE IN ACOUSTIC IMAGING TRANSDUCERS

[75] Inventor: John D. Larson, III, Palo Alto, Calif.

[73] Assignee: Hewlett-Packard Company, Palo Alto, Calif.

[21] Appl. No.: 20,007

[22] Filed: Mar. 12, 1979

[51] Int. Cl.[3] .............................................. H01L 41/08

[52] U.S. Cl. ...................................... 310/326; 73/632; 128/660; 310/327; 310/334; 310/336

[58] Field of Search ............... 310/321, 322, 323, 326, 310/334–337, 328; 128/660, 663; 340/5 H, 5 MP, 8 MM, 8 FT, 9, 10, 15, 17 R; 73/632, DIG. 4

[56] References Cited

U.S. PATENT DOCUMENTS

| | | | |
|---|---|---|---|
| 3,036,231 | 5/1962 | Henry | 310/336 X |
| 3,058,015 | 10/1962 | Nesh | 310/334 |
| 3,365,590 | 1/1968 | Lobdell | 310/334 X |
| 3,543,058 | 11/1970 | Klemens | 310/334 X |
| 3,714,475 | 1/1973 | Baker, Jr. | 310/321 |
| 4,101,795 | 7/1978 | Fukomoto et al. | 310/336 |
| 4,122,725 | 10/1978 | Thompson | 310/326 X |
| 4,158,787 | 6/1979 | Forward | 310/326 X |

FOREIGN PATENT DOCUMENTS

| | | | |
|---|---|---|---|
| 879929 | 6/1953 | Fed. Rep. of Germany | 310/334 |

*Primary Examiner*—Mark O. Budd
*Attorney, Agent, or Firm*—Edward Y. Wong

[57] ABSTRACT

Spurious emissions caused by a newly-described vibration mode in an acosutic imaging transducer are suppressed by cancelling the net displacement of the center of mass of each piezoelectric element in the transducer array.

3 Claims, 7 Drawing Figures

APPARATUS AND METHOD FOR SUPPRESSING MASS/SPRING MODE IN ACOUSTIC IMAGING TRANSDUCERS

BACKGROUND AND SUMMARY OF THE INVENTION

A typical acoustic imaging transducer consists of an array of piezoelectric elements disposed on a planar surface for radiating an acoustic beam in a direction generally normal to that surface and for receiving reflecting pulses from a target in the patient. The elements vibrate in several modes while producing acoustic signals. The preferred mode for producing the desired beam is referred to herein as the thickness mode. By selectively phasing transmitter elements, the beam can be focused at a predetermined distance and scanned azimuthally.

The elements, being bilateral in function, generate two fundamental beams in diametrically opposed directions. In general, for good depth resolution, one of the beams has to be absorbed and that energy has to be dissipated using some form of an acoustic absorber. Conversely, the effectiveness of the transmitted beam is maximized by controlling its direction and suppressing or cancelling spurious emissions produced by undesirable modes of vibration in each of the elements.

One mode of undesirable vibration not well understood until now may be described by analogy of one of the elements to a mass/spring harmonic oscillator. This mode of vibration is called the mass/spring mode hereinafter. The mass/spring mode is compared with the desired thickness mode in FIG. 1(*a*) and 1(*b*). In the model, the backing is analogous to the "spring", or energy storage mechanism, while the PZT element bonded to the backing is the "mass". This model assumes the kinetic energy is all contained in the "mass", while all the elastic energy is stored in the "spring", i.e., negligible motion of the backing. This model further assumes rigid body motion rather than wave motion, which is ordinarily obtained in high frequency acoustic devices, and that the element is tall and narrow to obtain the relative frequencies shown.

The backing represents a relatively solid, unmoving foundation for the element as compared to the negligible loading on the element's top surface. Therefore, a voltage applied to the PZT will cause the top surface of the element to move while the bottom surface will remain relatively stationary. Thus, in the proposed model, there is net displacement of the element and excitation of the mass/spring mode.

Another undesirable mode of vibration of elements in the transducer, referred to as the dilatational mode, is also illustrated in FIG. 1(*a*) and compared with the other modes mentioned in FIG. 1(*b*). Dilatation refers to the particle motion being primarily transverse to the element. The relative frequency responses of the various modes are also illustrated in FIG. 1(*a*).

A piezoelectric plate, from which the elements of an imaging transducer array are formed, will expand if a voltage is applied one way with respect to the poling direction, and will contract if the voltage is reversed. In either case, the center of mass will move with respect to the backing top surface, and the mass/spring mode will be excited. In the preferred embodiment of the present invention, two such plates are bonded together with their respective poling vectors appropriately directed. As appropriately polarized voltages are applied to the plates, one plate expands while the other contracts. If the expansion of one plate is approximately equal to the contraction of the other, center of mass motion and, hence, the mass/spring mode is suppressed.

DESCRIPTION OF THE DRAWING

FIG. 1(*b*) is a mode chart for the modes of FIG. 1(*a*).

FIG. 2(*b*) is another embodiment of the element of FIG. 2(*a*).

FIG. 5(*b*) is a graph showing input impedance measured vs frequency for the element of FIG. 2(*a*).

DESCRIPTION OF THE PREFERRED EMBODIMENT

Figure 1A:
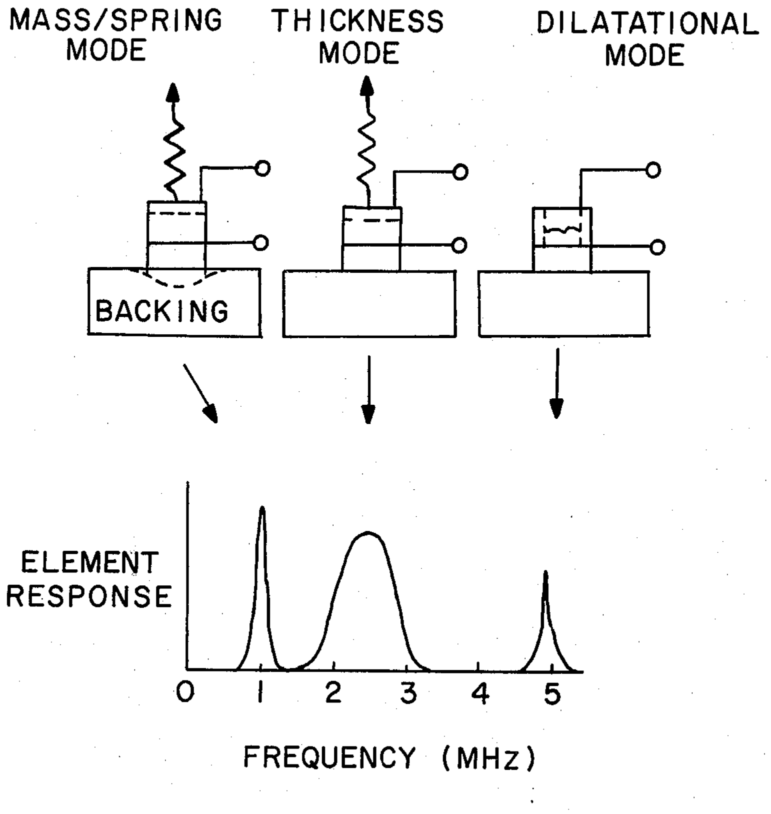
FIG. 1(*a*) is a cross-sectional view of one element of an acoustic imaging transducer illustrating three different modes of vibration thereof and the relative frequency response for each of the modes.
Figure 1B:
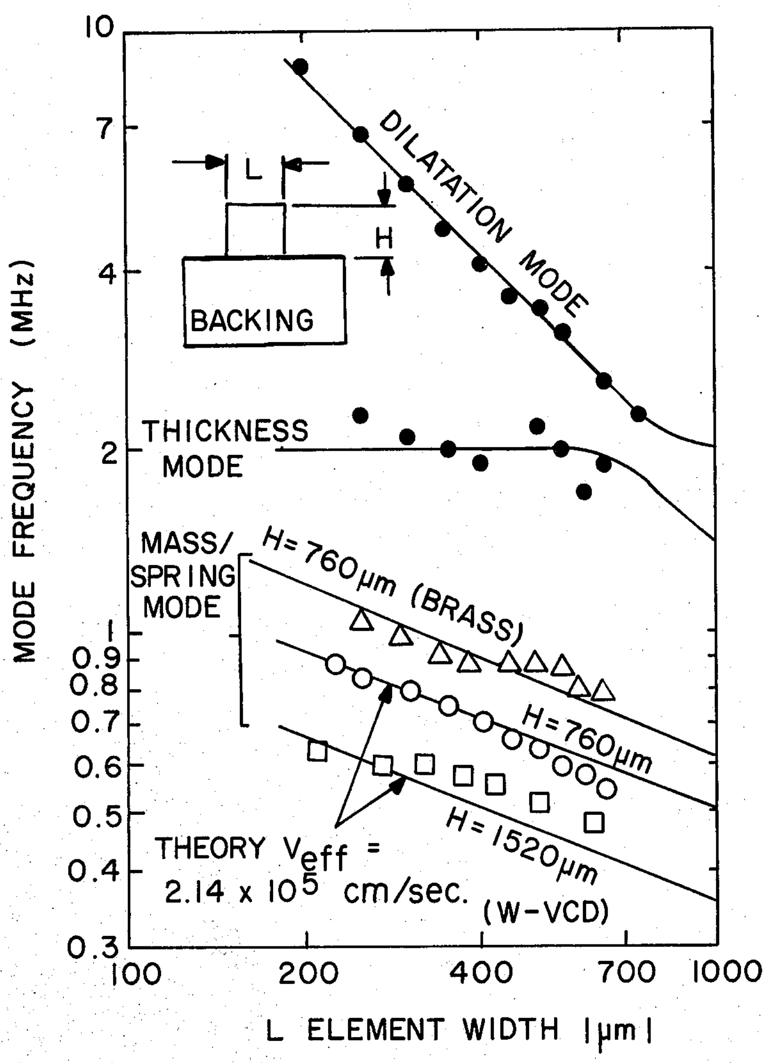
Figure 2A:
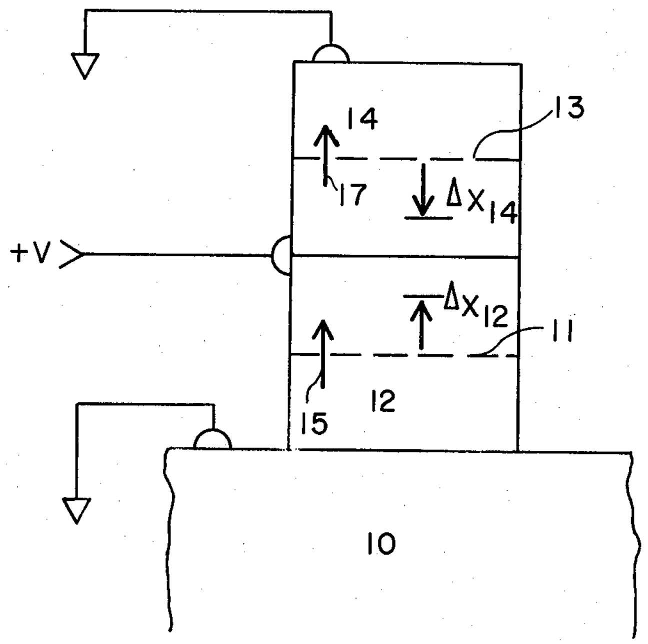
FIG. 2(*a*) is a cross-sectional view of one element of an acoustic imaging transducer including mass/spring mode cancellation according to the preferred embodiment of the present invention.
Figure 2B:
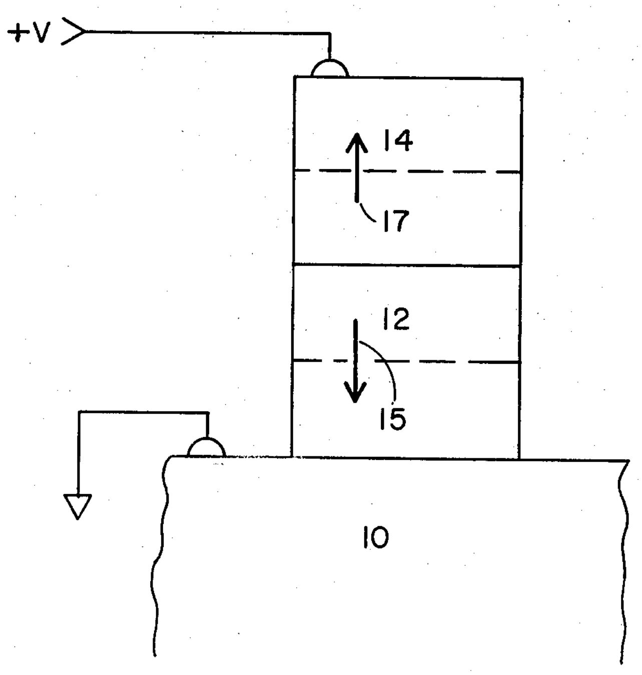

Referring to FIG. 2(*a*), a piezoelectric element of an acoustic transducer array constructed according to the preferred embodiment of the present invention comprises primary plate 12 affixed to compensator plate 14. Each of the plates are formed of piezoelectric material, such as lead zirconate titanate or quartz, and are poled according to poling vectors 15 and 17. When utilized as an acoustic wave radiator, the element is mounted on backing 10.

Electrically, plates 12 and 14 are coupled in parallel. Therefore, the capacitance is approximately twice the value as for a single plate. Such high capacitance is advantageous when driving the transducer from a long, high capacitance cable.

Another electrical connection which also cancels the mass/spring mode is shown in FIG. 2(*b*). The plates are poled in opposite directions as shown and connected in series electrically. The capacitance is about half the value of the single plate and one-fourth the value of the embodiment of FIG. 2(*a*).

In either coupling, the mass/spring mode frequency of the two plate scheme is $1/\sqrt{2}$ less than the single plate frequency, owing to the increased mass of the element when compensator plate 14 is added. Thus, excitation of the unwanted mass/spring mode is cancelled or greatly reduced and, if an emission is still detectable, the frequency of the emitted signal is lower. Greater rejection between the desired thickness mode and the undesired mass/spring mode is therefore achievable.

Figure 3:
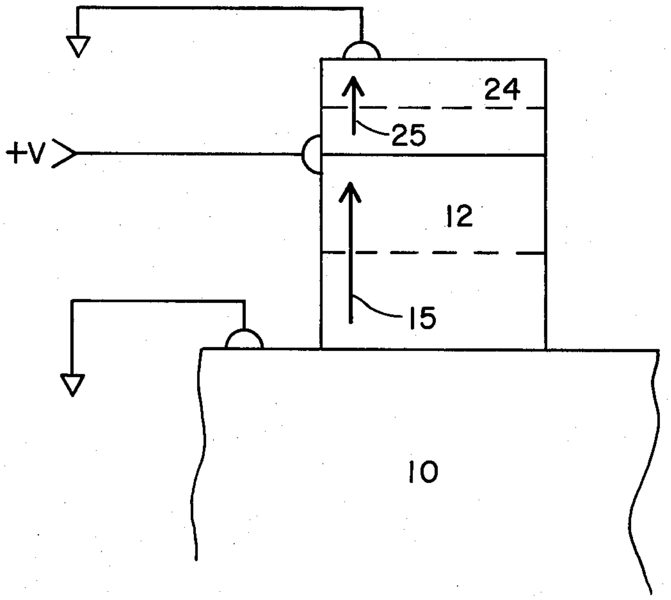
FIG. 3 is another embodiment of the element of FIG. 2(*a*).

By adding compensator plate 14, the bandwidth of the desired thickness mode is also reduced because of the increased mass loading. To minimize this effect, the compensator plate 14 can be made thinner. If a different piezoelectric material having higher expansion rate per volt of drive is used as shown in FIG. 3, comparable displacement of thinner compensator plate 24 is obtained for the same voltage drive to provide similarly reduced, even near-zero motion of the center of mass of the element. Of course, the electrical connection of FIG. 2(*b*) can be used if the poling of one of the plates is inverted.

Referring again to FIG. 2(*a*), application of the voltage causes plate 14 to contract and the center of mass in neutral plane 13 to move toward backing 10 an amount $\Delta X_{14}$ and causes plate 12 to expand and the center of mass in neutral plane 11 to move away from backing 10 an amount $\Delta X_{12}$. For net zero motion of the center of mass of the system, $$m_{12}\Delta X_{12}+m_{14}\Delta X_{14}=0, \quad (1)$$

where $m_{12}$=mass of plate 12, and $m_{14}$=mass of plate 14.

The strain, S, in each plate can be expressed as $$S_{12}=\Delta X_{12}/H_{12} \quad (2)$$

$$S_{14}=\Delta X_{14}/H_{14} \quad (3)$$

where $H_{12}$ and $H_{14}$ are thickness dimensions of plates 12 and 14, respectively.

The electric field is given by $$E_{12}=-V/H_{12} \quad (4)$$

$$E_{14}=+V/H_{14}. \quad (5)$$

From the zero center of mass condition, $$S_{12}=\frac{-\rho_{14}}{\rho_{12}}\left(\frac{H_{14}}{H_{12}}\right)^2 S_{14} \quad (6)$$

where $\rho_{12}$=density of plate 12, $\rho_{14}$=density of plate 14.

By the constitutive relations between stress T, strain S, electric field E, and electric displacement D (omitting tensors), $$T=c^{E}S-eE \quad (7)$$

and $$D=eS+\epsilon^{S}E,$$

where $c^E$=elastic stiffness—effective e=piezoelectric constant—effective $\epsilon^S$=dielectric constant.

To cancel the mode electrically, no charge should flow because of strain S. Thus, $$e_{12}S_{12}+e_{14}S_{14}=0 \quad (8)$$

which yields $$\frac{H_{14}}{H_{12}}=\sqrt{\frac{\rho_{12}}{\rho_{14}}\cdot\frac{e_{14}}{e_{12}}}\,. \quad (9)$$

Hence, by selection of the piezoelectric material, a thinner compensator plate may be employed. For example, using PZT-5H for primary plate 12 and lead metaniobate (PBN) for compensator plate 14, the plate characteristics are given below:

$$\left.\begin{array}{l}\rho_{12}=7.4\ \text{kgm/m}^3\\ e_{12}=23.3\ \text{C/m}^2\end{array}\right\}\ PZT5H$$

$$\left.\begin{array}{l}\rho_{14}=6.0\ \text{kgm/m}^3\\ e_{14}=3.61\ \text{C/m}^2\end{array}\right\}\ \text{PBN}$$

The plate thicknesses for a 2.5 MHz transducer are:

$H_{12}$=25.7 mils $H_{14}$=11.4 mils

It is clear that simultaneous cancellation of the mass/-spring mode and radiation of acoustic energy via the thickness mode of the transducer is possible. Whenever the front face of the transducer array moves, acoustic waves are radiated. In the mass/spring mode, the entire element moves as a rigid body and the front face simply follows the movement. In the thickness mode, acoustic waves travel in the transducer, not all particles in the element are moving in the same direction at any instant in time. This distinction between the mode mechanics allows cancellation of the mass/spring mode while retaining the thickness mode.

The mass/spring mode cancellation connection of the present invention reduces the voltage of the pulse required to excite the transducer for a specified acoustic output power level. Since transducer bandwidth decreases from approximately 73% for the single plate configuration to approximately 52% for the double plate configuration of the present invention, pulse duration for the thickness mode is increased. The pulse is composed of a contribution from the thickness mode and from the mass/spring mode. The pulse duration is dominated by the spurious modes rather than by the fundamental frequency limitation of the thickness mode in such transducers. Hence, by substantially reducing the spurious modes, very little change in overall pulse width is obtained.

The source capacitance afforded by the parallel-connected mass/spring mode cancellation transducer is approximately twice that of prior art transducers. Transducers typically must drive up to six feet of coax cable whose total capacitance is large compared to transducer capacitance and voltage divider action results. By increasing the source capacitance, less of the signal voltage is lost due to such divider action.

Figure 4:
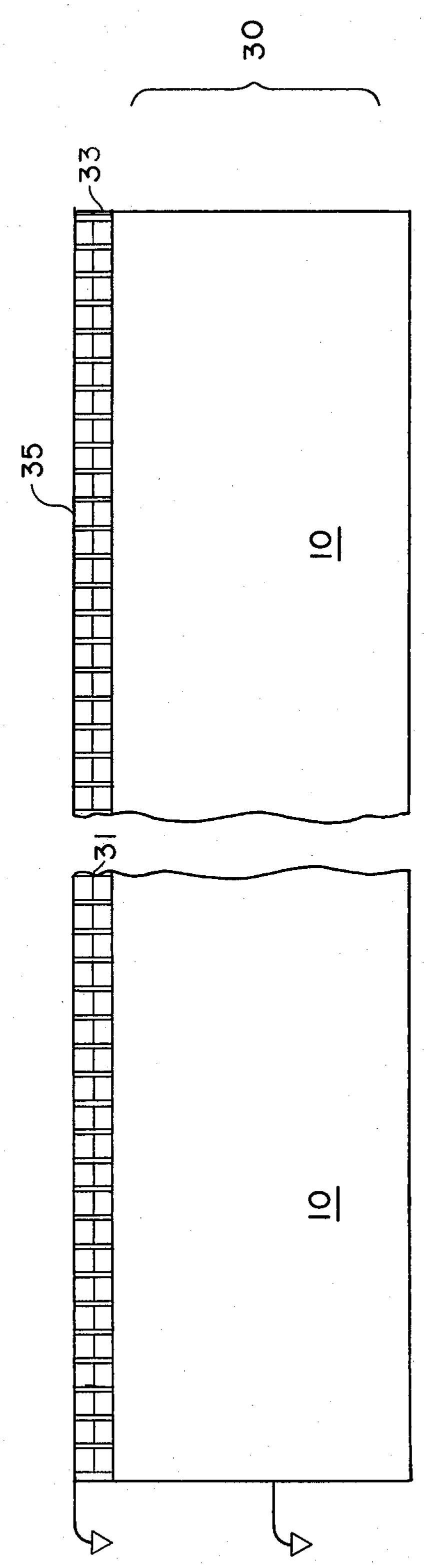
FIG. 4 is a cross-sectional view of an acoustic imaging transducer employing elements constructed as shown in FIG. 2(*a*).

A typical acoustic transducer array launches acoustic pulses in a prescribed direction and receives echoes from directions up to ±45° off the normal to the array. To achieve those functions, the transducer should have a wide aperture to achieve good angular resolution and a sufficient number of elements to sample the aperture. Therefore, the preferred embodiment of the present invention, generally designated 30 in FIG. 4, comprises backing 10, 84 elements spread over about 1 inch, a typical one of which being designated 33, and foil 35 operating at about 2.5 MHz center frequency. In this configuration the transmitted/received pulse is on the order of 1 to 3 μsec. in duration, corresponding to 0.8 mm to 2.3 mm resolution.

Preferably, each of the relatively tall, narrow, closely packed elements of this configuration should be independent in operation, i.e., have little or no effect on adjacent elements.

Backing 10 is metallized to obtain a ground connection. Two layers of PZT are sequentially epoxy-bonded to backing 10 so that metal intermediate electrode, typically designated 31, is available for electrical connection to each element 33.

The required number of elements 33 are formed by sawing the PZT with a thin diamond saw. In one such embodiment, the elements are approximately 250 μm wide while the spaces between, also known as kerfs, are about 70 μm wide. The kerfs separate the elements and give them electrical and acoustical independence (at least to first order). The total height of the elements is approximately 900 μm or about 3.6 times the width. The elements are spaced less than half an acoustic wavelength apart, so acoustic cross-coupling can be high. However, as discussed later in this specification, the compensated element tends to decrease this coupling.

To complete the transducer, thin metal foil 35 is bonded across the top of the elements. Foil 35 provides grounding of the top of elements 33 and a solid base upon which to glue an acoustic lens (not shown). The lens serves to isolate the patient electrically from the transducer and functions to provide some fixed focusing in the plane orthogonal to that of the sector scan.

Figure 5A:
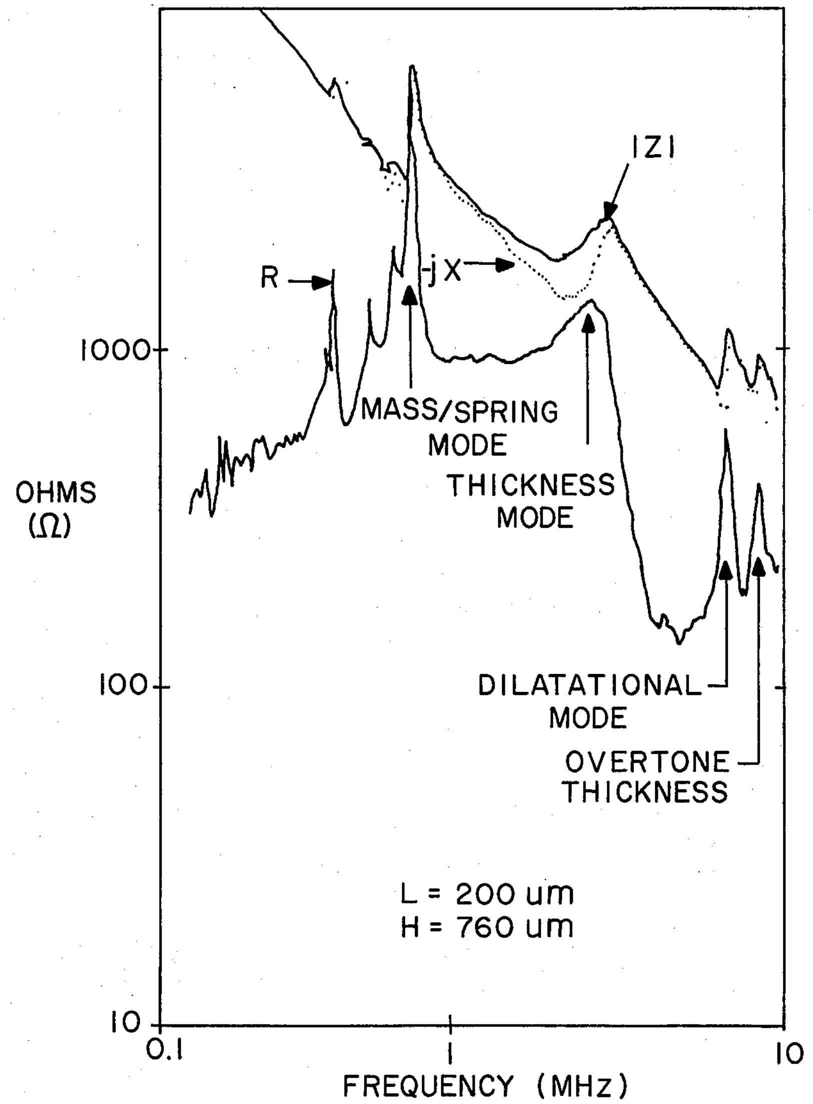
FIG. 5(*a*) is a graph showing input impedance measured vs frequency with the various modes of vibration identified for an element of a typical prior art transducer.
Figure 5B:
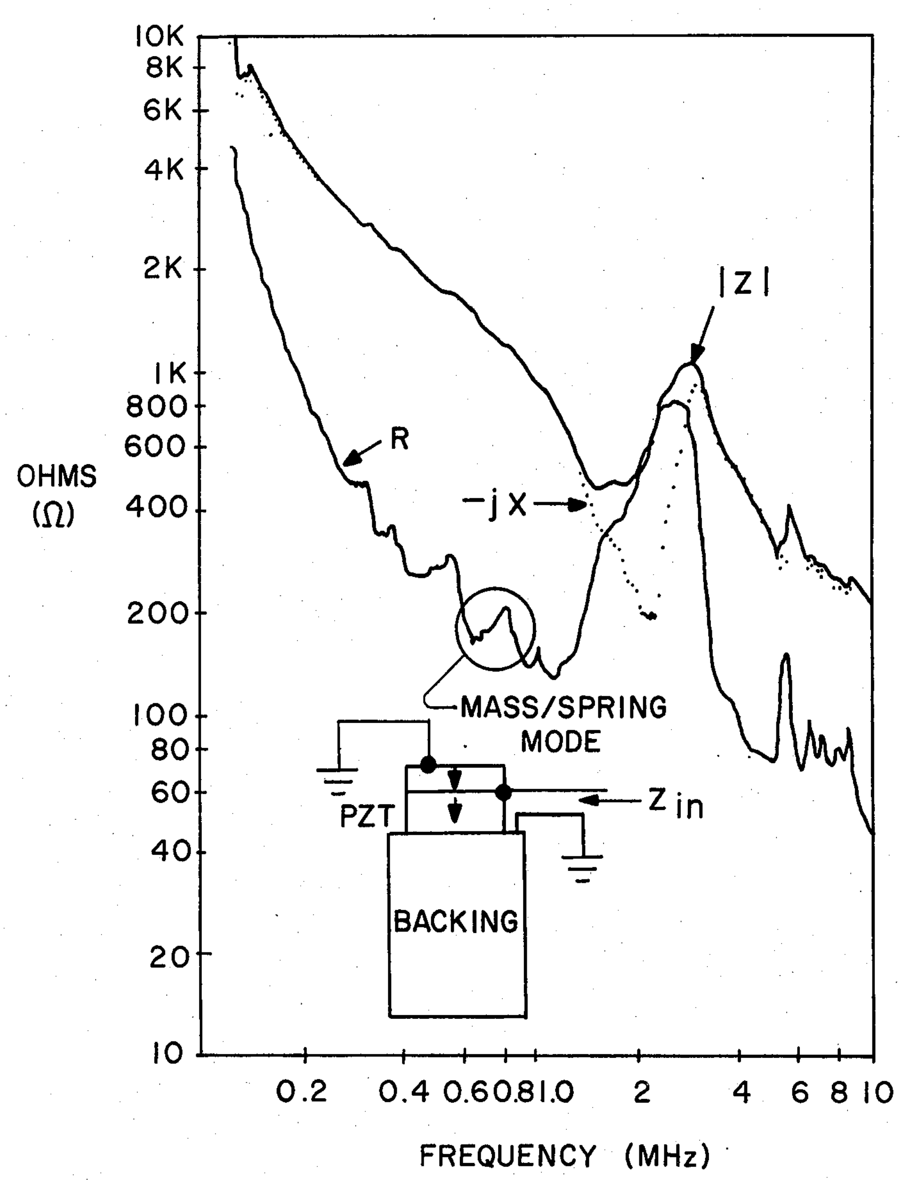

For parallel connection of the array of FIG. 3, measurement of the input impedance, $Z=R+jX$, as a function of frequency shows that the low frequency mode is substantially changed and reduced as illustrated by comparing FIGS. 5(*a*) and 5(*b*). The desired thickness mode is decreased in bandwidth, but more strongly excited. The adjusted radiation resistance in this mode is reduced from perhaps 1000 ohms in the uncompensated case to about 500 ohms in the present invention.

An excited element uncompensated for mass/spring mode vibration may launch a surface wave on an array of such elements. Such a surface wave traveling down the array will lead to radiation at oblique angles from the array. Such radiation is highly undesirable in acoustic imaging systems, since it interferes with receiving acoustic signals reflected from targets at which they are aimed.

As an acoustic wave is produced and radiated away into the patient by pulsing an element of the array, an acoustic pulse and a damped sinusoidal surface wave train propogates along the array structure. The latter propogated wave is received and reconverted to an electrical signal by a distant element which resonates in the mass/spring mode in response thereto. As this wave propogates along the array, it excites each element in turn which results in a wave being radiated away into the patient. This wave will radiate at a large angle as determined by phase matching conditions. Thus, a large amplitude, long duration pulse is radiated from the array with a delay proportional to the propogation delay over the path traveled.

An excited transmitter element, connected to cancel the mass/spring mode according to the present invention, will transmit a short surface wave pulse and a faster decaying sinusoid. The time required for the sinusoid to decay to a level near the thermal noise level is hereafter called "ring-down time". If both transmitter and receiver elements have been mass/spring mode compensated as would be the case in a fully compensated transducer, the received signal is much smaller, and the ring-down time is much shorter than for uncompensated elements. Since the ring-down time is shorter, targets close to the transducer can now be detected because the elements are ready sooner to receive reflected signals therefrom. In addition, excitation of low frequency surface waves is reduced which, in turn, reduces spurious low frequency signals radiated at large angles to the transducer normal.

The mass/spring mode compensated transducer essentially substitutes an alumina insulator layer in a prior art standard transducer with a PZT-5H layer or some other piezoelectric material. Since PZT is softer, its preparation, including cutting and polishing, is much easier. Fabrication of the transducer is therefore less expensive.

I claim:

1. An acoustic imaging transducer comprising:

an acoustic absorbing backing; and a plurality of piezoelectric elements affixed to a surface of the backing for radiating and receiving acoustic waves, each of said elements including suppression means for suppressing spurious acoustic waves produced by mass/spring mode vibration.

2. An acoustic imaging transducer as in claim 1 wherein the suppression means includes a second layer of piezoelectric material and a second layer of electrically conductive material.

3. An acoustic imaging transducer as in claim 2 wherein each of said elements for radiating acoustic waves has a first layer of piezoelectric material affixed to the backing, a first layer of electrically conductive material affixed to the first layer of piezoelectric material, the second layer of piezoelectric material affixed to the first layer of electrically conductive material, and the second layer of electrically conductive material affixed to the second layer of piezoelectric material, the first and second layers of piezoelectric material being electrically coupled such that both layers are energized simultaneously.

* * * * *